(12) United States Patent
Chu et al.

(10) Patent No.: US 6,995,045 B2
(45) Date of Patent: Feb. 7, 2006

(54) THIN FILM TRANSISTOR AND METHOD OF FORMING THIN FILM TRANSISTOR

(75) Inventors: Hung-Jen Chu, Nantou (TW); Nei-Jen Hsiao, Chia-I (TW); Hui-Chung Shen, Tainan (TW); Meng-Chi Liou, Tao-Yuan (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 10/378,948

(22) Filed: Mar. 5, 2003

(65) Prior Publication Data
US 2004/0173848 A1    Sep. 9, 2004

(51) Int. Cl.
H01L 21/355    (2006.01)

(52) U.S. Cl. .......... 438/142; 435/45; 435/46; 435/149; 435/154; 435/482; 435/488

(58) Field of Classification Search ........ 438/149–166, 438/424–432, 479, 790
See application file for complete search history.

(56) References Cited

U.S. PATENT DOCUMENTS 5,622,814 A * 4/1997 Miyata et al. .............. 430/314
6,486,010 B1 * 11/2002 Hsu ............................ 438/158
6,589,825 B2 * 7/2003 Kim ........................... 438/151

OTHER PUBLICATIONS

Van Calster et al., "A simplified 3-step fabrication scheme for high mobility AMLCD panels," Proceedings of the 14th International Display Research Conference, 1994, pp. 289-290.
K. Ono, "A Simplified 4 Photo-mask Process for 24cm Diagnol TFT-LCDs," Asis Display '95, 1995, p. 693.
Chang W. Han et al., A TFT Manufactured by 4 Masks Process with New Photolithography, Asia Display '98, 1998, p. 1109.

* cited by examiner

Primary Examiner—Long Pham
Assistant Examiner—Wai-Sing Louie
(74) Attorney, Agent, or Firm—Birch, Stewart, Kolasch & Birch, LLP

(57) ABSTRACT

The thin film transistor has a non-transparent structure besides and insulated with the gate. Hence, the light transmitted from the substrate is blocked and the light current induced in the thin film transistor is negligible. The method uses a mask with a slit pattern to form a non-uniform photoresist. Hence, the mask could be used to pattern two conductor layers for forming source/drain/channel.

16 Claims, 9 Drawing Sheets

THIN FILM TRANSISTOR AND METHOD OF FORMING THIN FILM TRANSISTOR

BACKGROUND OF THE INVENTION

1. Field of the Invention

This invention generally relates to a thin film transistor (TFT) and a method of forming the same. More particularly, the present invention relates to a TFT with non-transparent conductive structures under conducting wires that electrically couple with a drain/source, and a method of forming the TFT by-using a mask with a slit pattern.

2. Description of the Prior Art

TFTs have been broadly used in contemporary electronic products such as switching on/off pixels in a liquid crystal display (LCD) panel. Hence, the topic of how to improve the structure and forming method for TFT has been popularly discussed.

A well-known TFT structure, as shown in FIG. 1, at least includes following units over a substrate 10: a conductive structure 11, a first dielectric layer 12, a first semi-conductive layer 13, a second semi-conductive layer 14, and a second dielectric layer 15 that is electrically coupled with a conducting wire 16 (patterned conductive structure). Herein, the conductive structure 11 is used as a gate. The first semi-conductive layer 13 is used as a channel and the second semi-conductive layer 14 can be used as a drain or a source. The first dielectric layer 12 and the second dielectric layer 15 are used as insulating and protective material. The conducting wire 16 is used in electrically coupling the drain with external circuits. However, FIG. 1 did not illustrate conducting wires, which electrically couple the gate and the source with external circuits. Basically, the source electrically coupled with external circuit via the conducting wire in the second dielectric layer, and the gate electrically coupled with external circuit via the conducting wire through the first and the second dielectric layer.

Obviously, five masks and pattern-transferred processes are essential for forming the TFT while each patterned layer requires corresponding mask and process, since the patterns of the conductive structure 11, the first semi-conductive layer 13, the second semi-conductive layer 14, the second dielectric layer 15 and the conducting wire 16 are different from each other. Hence, many techniques for reducing required masks and processes have been continually brought out in order to save the material cost, to shorten the process time, and to improve the production ability.

For example, in a prior art, two masks were combined to form the one for forming the second semi-conductive layer 14 and the conducting wire 16 with the same material. However, the optimum cannot be achieved by using the same material since the requirements between the conducting wire and the source/drain are different. In another prior art, two masks were combined to form the one for forming the second dielectric layer 15 and the first semi-conductive layer 13. By doing so, the problems such as higher leakage current ($I_{off}$) and drop height may be resulted from the structure of TFT size. In still another prior art, two masks were combined to form the one for forming the first semi-conductive layer 13 and the second semi-conductive layer 14. However, the practical application can be quite difficult since the special exposure technique is required for the half tone mask. As to these techniques mentioned above can refer to as followings: A. Van Calster et. al. "A Simplified 3-Step Fabrication Scheme for high Mobility AMLCD Panels"; K. Ono et. al. "A Simplified 4 photo-Mask Process for 34-cm Diagonal TFT-LCDs" IDRC 1995; and Chang W. H. et. al. "A TFT Manufactured by 4-Msks Process with new Photolithography" IDRC 1998.

Besides, the light is transmitted to the TFT from the back of the substrate 10 while the TFT is used in a LCD panel, and the first dielectric layer 12 in a prior art is commonly the transparent material, hence the first semi-conductive layer 13, the second semi-conductive layer 14 and the conducting wire 16 may induce the light current (such as the electron-hole pairs excited in semiconductor by the light) resulting to the problem of leakage current or noise.

As mentioned above, there is much space for improving a well-known structure and forming method for TFT. Hence, these problems of how to reduce the required mask in forming TFT process and how to prevent TFT from inducing the light current need to be solved.

SUMMARY OF THE INVENTION

According to the shortcomings mentioned in the background, the present invention provides a method for only using four masks in forming a TFT, and a TFT for preventing the light current effectively to improve the foregoing drawbacks.

One characteristic of the present invention is to use the same mask to define a source, a drain and a channel, and more particularly, using a mask with a slit pattern forms a non-uniform photoresist, as well as transfers patterns of the source, of the drain, and of the channel to corresponded semi-conductive layer.

Another characteristic of the present invention is that the TFT has a non-transparent conductive structure, which is at least positioned under the conducting wires of the source/drain/channel, beside and insulated with the gate. By doing so, the light transmitted from the substrate is blocked and the light current induced in the TFT is negligible.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, which are given by way of illustration only, and thus are not limitative of the present invention, and wherein.

DESCRIPTION OF THE PREFERRED EMBODIMENT

One preferred embodiment of the present invention is a method for forming a TFT, at least including the basic process steps described as below.

Figure 2A:
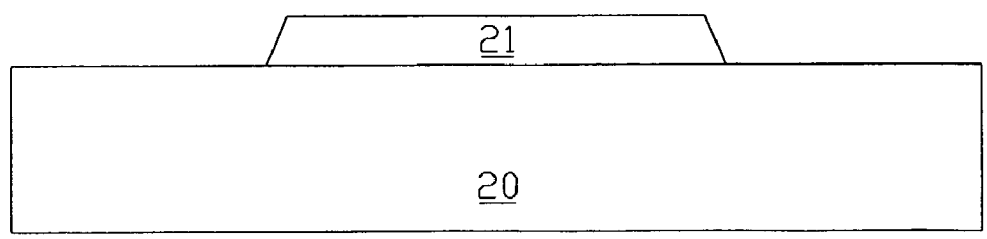
FIGS. 2A to 2H show the basic processes in accordance with the present invention for forming a TFT.

As shown in FIG. 2A, a substrate 20 is provided and a gate 21 is formed on the substrate 20.

Figure 2B:
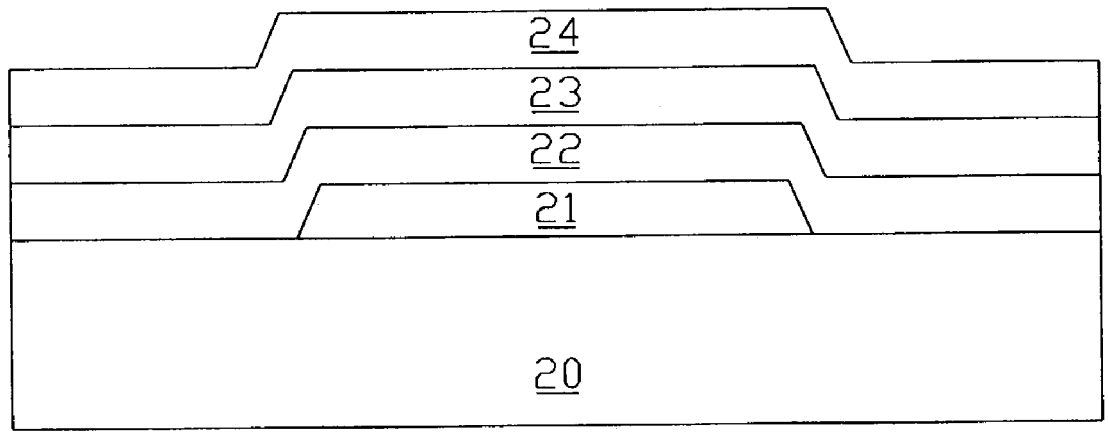

As shown in FIG. 2B, a dielectric layer 22 is formed on the substrate 20 and located over the gate 21, and then a first semi-conductive layer 23 and a second semi-conductive layer 24 is formed in proper sequence on the dielectric layer 22.

Figure 2C:
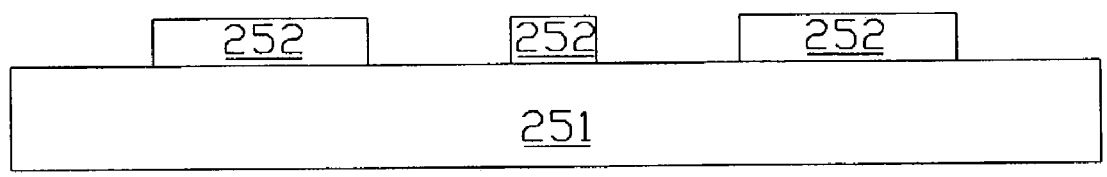
Figure 2C:
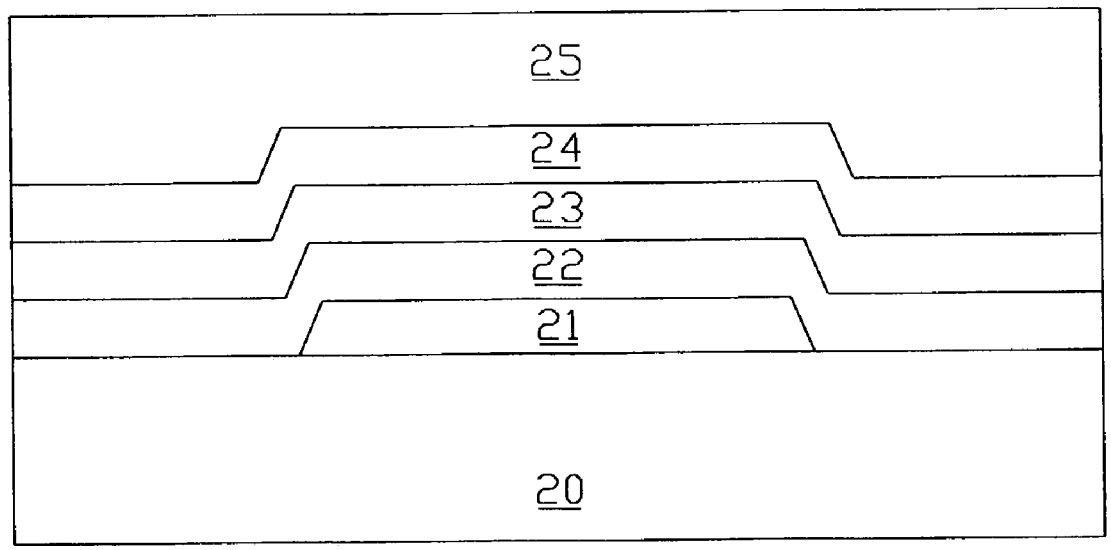

As shown in FIG. 2C, a photoresist layer 25 is formed on the second semi-conductive layer 24, and then a mask 251 is placed over the photoresist layer 25. Wherein the mask 251 has a slit pattern 252, which is just over the gate 21, and further, aims at the center of the gate 21.

Figure 2D:
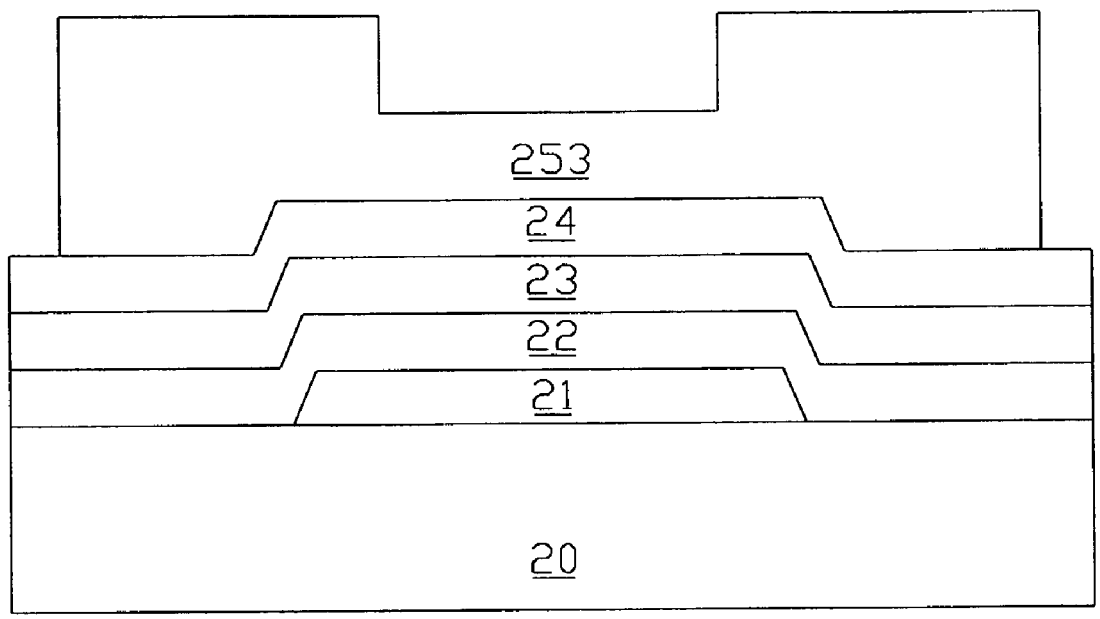

As shown in FIG. 2D, the photoresist layer 25 is patterned to form a photoresist pattern 253, which is just over the gate 21 (or still over the substrate 20 around the gate 21). Wherein the photoresist pattern 253 further includes a thin photoresist pattern formed under the slit pattern 252 and a thick photoresist pattern, due to diffraction caused by the slit pattern 252. However, the photoresist pattern 253, in fact, has no obvious changes in its thickness but arc changes. This illustration is just drawn to stress one characteristic of the present embodiment, did not restrict the photoresist pattern 253 to form as described above.

Figure 2E:
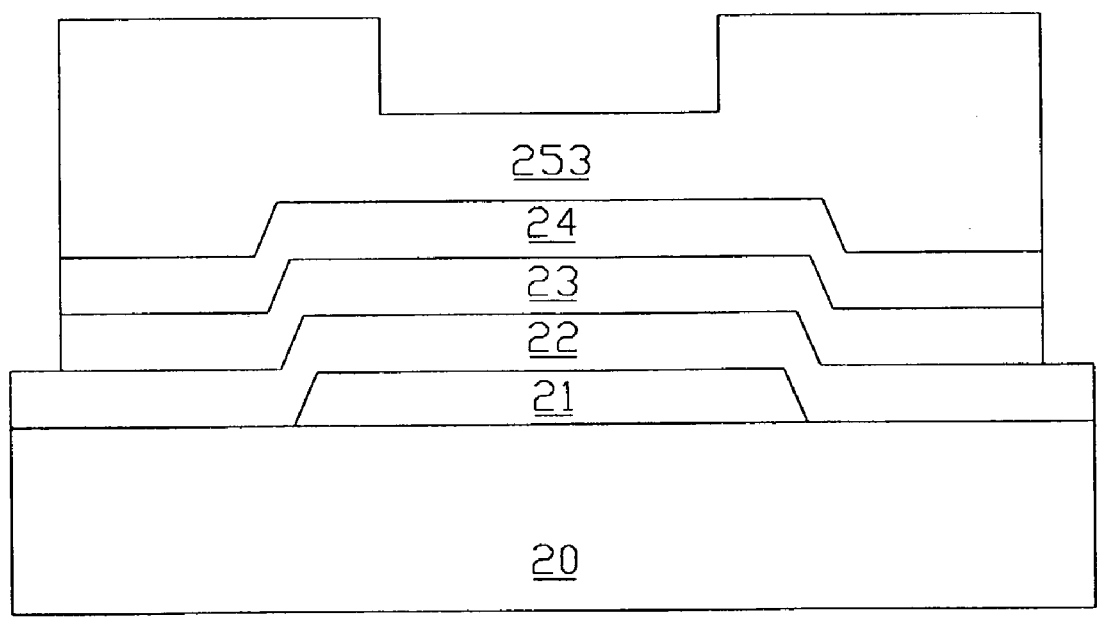

As shown in FIG. 2E, portions of second semi-conductive layer 24 and first semi-conductive layer 23 without the photoresist pattern 253 covering are removed, as well the dielectric layer 22 without the photoresist pattern 253 covering can be removed at the same time. The present embodiment does not restrict these details.

Figure 2F:
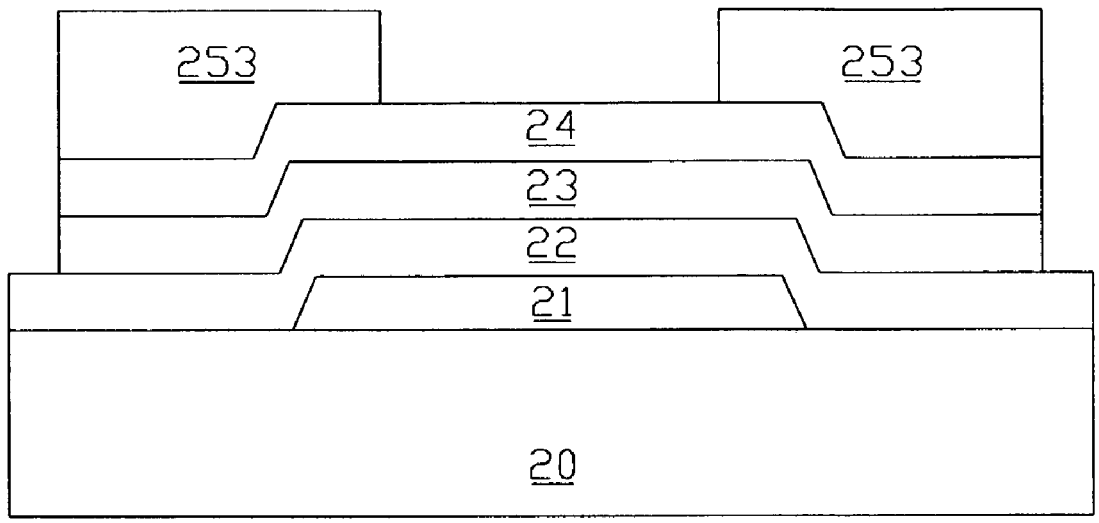

As shown in FIG. 2F, the whole part of the thin photoresist pattern is removed. This can be achieved by using a non-selective etching process to lower the thickness of the whole photoresist pattern 253 until the second semi-conductive layer 24 exposed or only removing the thin part of the photoresist pattern 253. The present embodiment does not restrict these details.

Figure 2G:
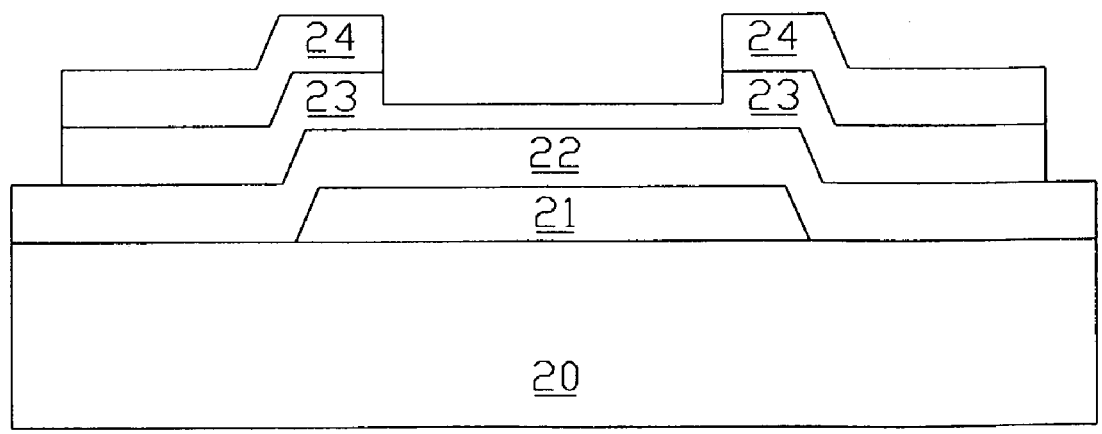

As shown in FIG. 2G, the portion of second semi-conductive layer 24 without the remained photoresist pattern 253 covering is removed, and then, the remained photoresist pattern 253 is removed. However, in accordance with forming different specifications of TFT, the first semi-conductive layer 23 without the remained photoresist pattern 253 covering also can be removed (or to be lowered) after removing the portions of second semi-conductive layer 24.

As described above, the present embodiment uses the mask 251 with the slit pattern 252 to define the patterns of the first semi-conductive layer 23 and the second semi-conductive layer 24 at the same time, so that the required masks can be reduced in forming TFT process. The present embodiment uses the single mask 251 and turns the photoresist layer 25 into the non-uniform photoresist pattern 253 by applying the characteristic of a diffraction pattern, which results from slit diffraction and gradually weakens from its center to both sides. Further, the semi-conductive layers 23 and 24 are patterned by using the non-uniform photoresist pattern 253 through two process steps (one is to use the whole non-uniform photoresist pattern 253; the other one is to remove the thin photoresist pattern 253 and then use the remained photoresist pattern 253). By doing so, only using one mask in the present embodiment makes respective pattern on the second semi-conductive layer 24 and the first semi-conductive layer 23.

Comparing the present embodiment with a well-known technique using the half tone mask, the basic process flows are the same for combining the photolithography processes of two semi-conductive layers by only using one mask. However, there is no extra requirement for special exposure processes but only some modifications on the mask since the present embodiment adopts silt diffraction. Hence, it is more convenient and saves the cost.

Figure 2H:
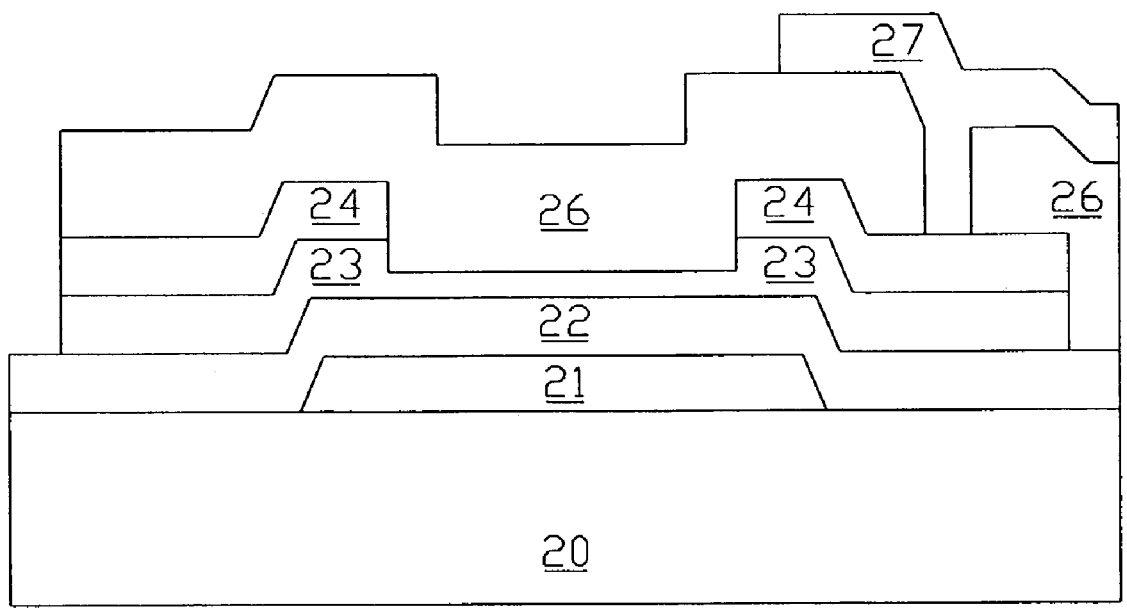

In order to form conducting wires to exchange signals with external circuits, the present embodiment, as shown in FIG. 2H, apparently can be further carried the processes out as followings: (These process steps are not described and illustrated in detail any more since they are not the characteristics of the present embodiment).

(1) After removing a portion of the second semi-conductive layer 24, the photoresist pattern 253 is removed and then an extra dielectric layer 26 is formed over the substrate and covers the first semi-conductive layer 23 and the second semi-conductive layer 24.

(2) The extra dielectric layer 26 is patterned to form an open region to expose the portion of the second semi-conductive layer 24. Apparently, there is no effect on the dielectric layer 21 if covered or not by the photoresist pattern 253 before since the extra dielectric layer 26 covers it now.

(3) The patterned conductive structure 27 is formed on the extra dielectric layer 26 and is filled in the open region.

Figure 3A:
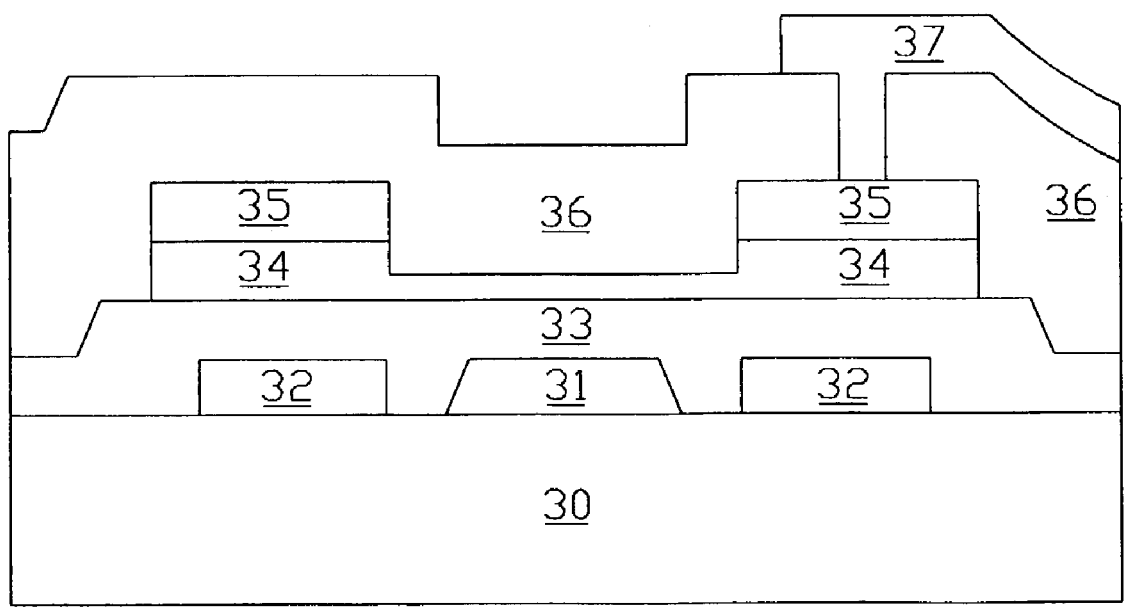
FIGS. 3A to 3D show several assumed structures of the TFT in accordance with the present invention.
Figure 3B:
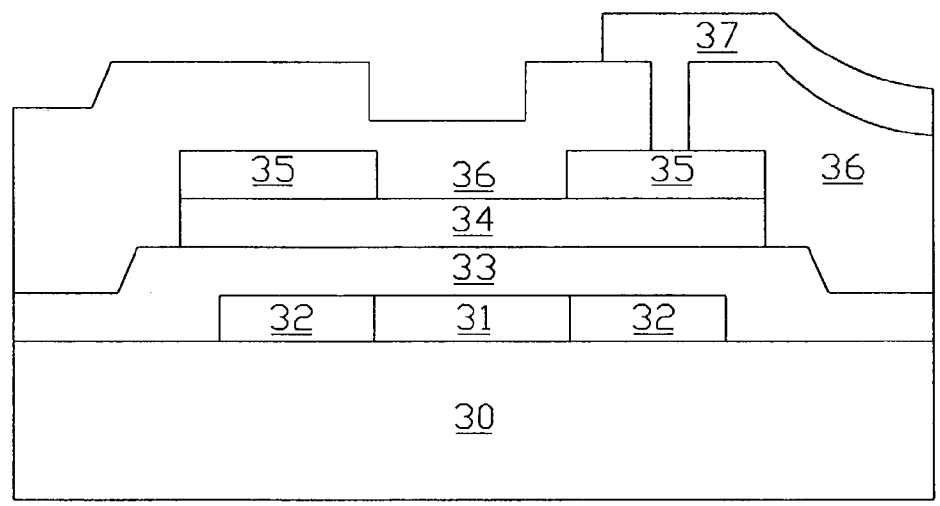

Another preferred embodiment in accordance with the present invention is a kind of TFT, as shown in FIG. 3A and FIG. 3B, at least including the basic units as followings: a conductive structure 31, a non-transparent structure 32, a first dielectric layer 33, a first semi-conductive layer 34, a second semi-conductive layer 35, a second dielectric layer 36 and patterned semi-conductive layer 37.

In the present embodiment, the conductive structure 31 is on the substrate 30; the non-transparent structure 32 is on the substrate 30 and electrically insulates from the conductive structure 31 (this is, the non-transparent structure 32 needs to be insulated from the conductive structure 31 while it is made of conductors, otherwise both of them can be connected together); the first dielectric layer 33 covers the substrate 30, the conductive structure 31 and the non-transparent structure 32; the first semi-conductive layer 34 is on the first dielectric layer 33, especially, on the conductive structure 31 and the non-transparent structure 32; the second conductive 35 is on a portion of the first semi-conductive layer 34, especially, on the conductive structure 31 and the non-transparent structure 32; the second dielectric layer 36 covers the substrate 30, the first semi-conductive layer 34 and the second semi-conductive layer 35, further has an open region on the second dielectric layer 36 to expose a portion of the second semi-conductive layer 35; the patterned semi-conductive layer 37 is on the second dielectric layer 36, further above the non-transparent structure 32, and is filled in the open region.

Figure 1:
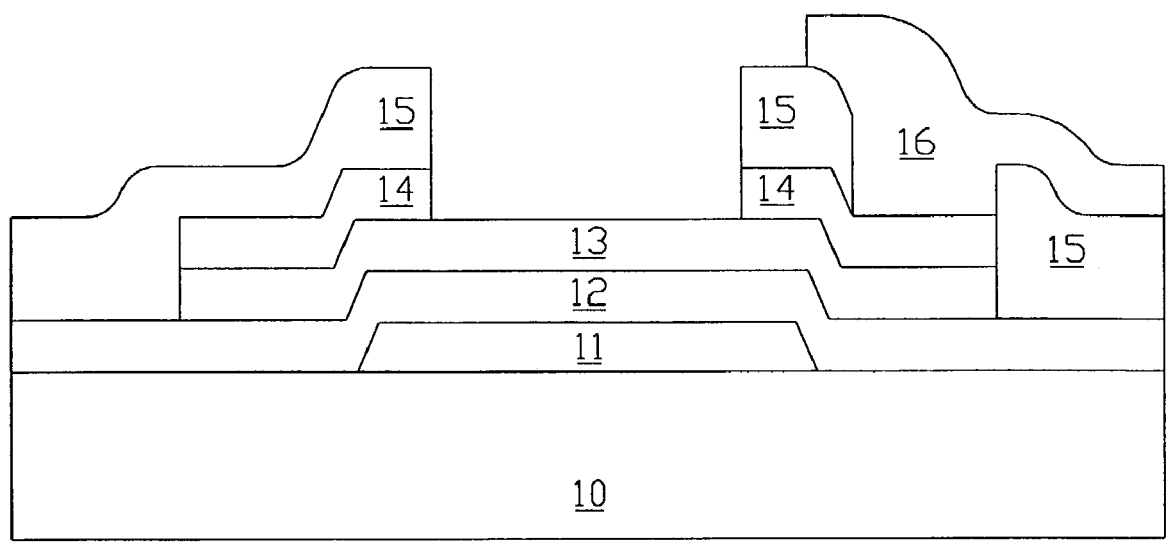
FIG. 1 shows cross-sectional views of the well-known structure of a TFT.

Comparing both FIG. 3A and FIG. 3B with FIG. 1, the obvious characteristic in the present embodiment is the existence of the non-transparent structure 32. Referring to well-known techniques, the light current may be induced in the portions of the first semi-conductive layer 13, the second semi-conductive layer 14 and the conducting wire 16 while the light is transmitted from the substrate 10 and these portions are not over the conductive structure 11. In accordance with the present embodiment, the non-transparent structure 32 can effectively block and reduce the light transmitted from the substrate 30 in the first semi-conductive layer 34, the second semi-conductive layer 35 and the patterned semi-conductive layer 37. Further, the use of the non-transparent can solve the drawbacks such as light current. Hence, there is no need to change the materials and layouts for the first dielectric layer 33, the first semi-conductive layer 34, the second conductive 35, the second dielectric layer 36 and the patterned semi-conductive layer 37 in the well-known TFT.

What is stressed here is that the present embodiment does not restrict the material to the non-transparent structure 32, and it can be a conductor or a dielectric. However, in order to simplify the structure and the method of the present embodiment, the same material can be used in forming the non-transparent structure 32 and the conductive structure 31 (the gate); both the non-transparent structure 32 and the conductive structure 31 are formed at the same time while the semi-conductive layer covered on the substrate 30 is patterned (this is, adjusting the mask, which is used to form the gate, forms the non-transparent structure 32 and the conductive structure 31). Besides, a shorter distance taken electrically insulation into account between the non-transparent structure 32 and the conductive structure 31 is preferable in order to block the light as much as possible. For example, the TFT of the present embodiment is formed by following the method in accordance with the prior embodiment. This is, the non-transparent structure insulated form the gate is formed by the way as the gate formed, and at least positions under the remained portion of the first semi-conductive layer.

Figure 3C:
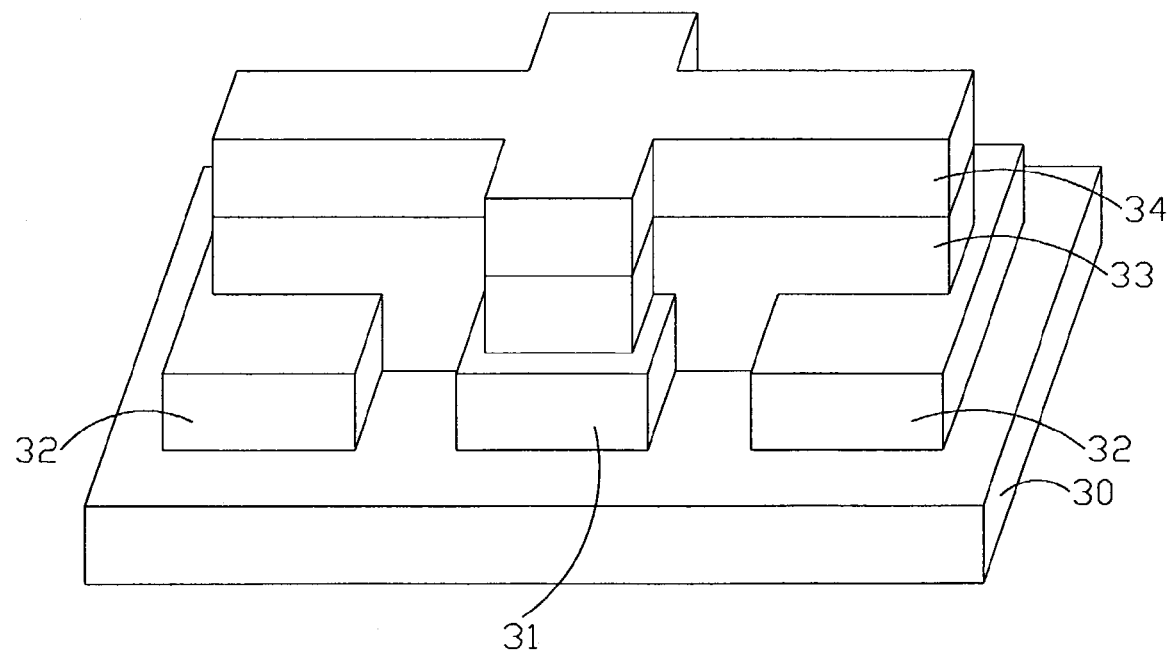
Figure 3D:
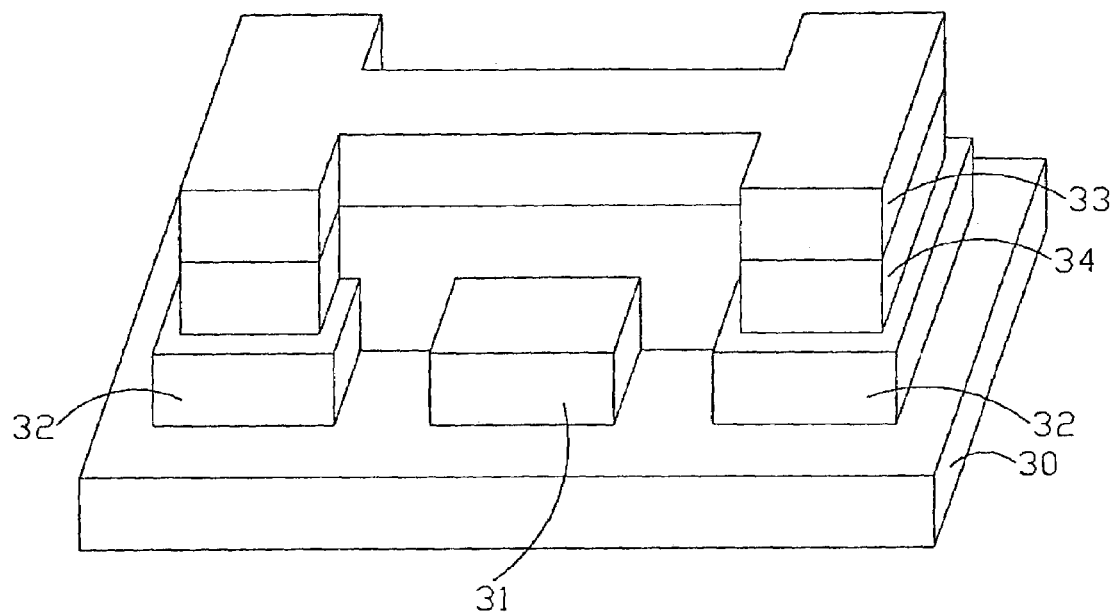

Further, in order to increase the portions, which are over both the non-transparent structure 32 and the conductive structure 31, of the first semi-conductive layer 34, the second conductive 35 and the patterned semi-conductive layer 37 to lower the possibility of the light current occurred, as shown in FIG. 3C and FIG. 3D, the present embodiment can make the portions over and along the edge of the conductive structure 31 wider than others no matter in the semi-conductive layers 34 or 35; the present embodiment also can make the portions over and along the edge of the non-transparent structure 32 wider than others no matter in the semi-conductive layers 34 or 35.

Still another embodiment in accordance with the present invention is the method of forming TFT, at least including the basic process steps described as below.

Figure 4A:
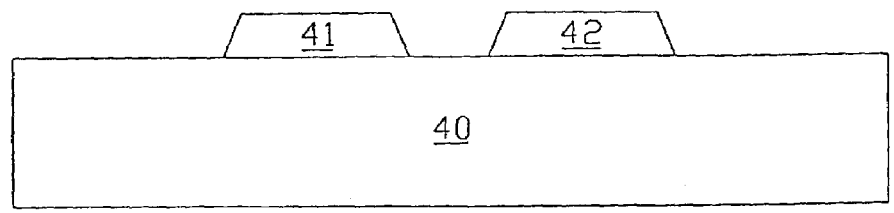
FIGS. 4A to 4E show another basic processes in accordance with the present invention for forming a TFT
Figure 4B:
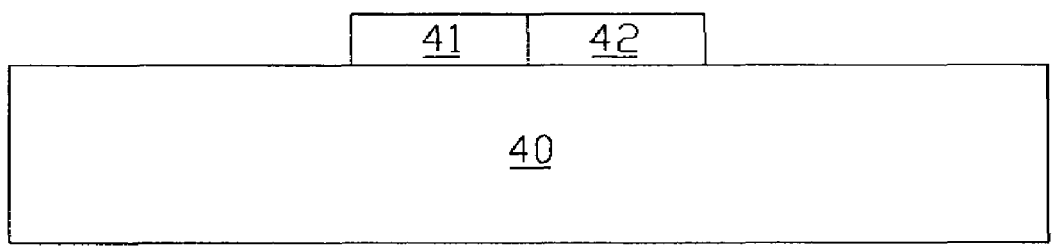

As shown in FIG. 4A, a substrate 40 is provided, and a conductive structure 41 and a non-transparent structure 42 are formed on the substrate 40. Herein, there is no any restriction on the distance or location between the conductive structure 41 and the non-transparent structure 42 but electrically insulation to each other. The conductive structure 41 and the non-transparent structure 42 do not be connected together while both of them are conductors. However, both of them can be connected together, as shown in FIG. 4B, while the non-transparent structure 42 is an insulator.

Figure 4C:
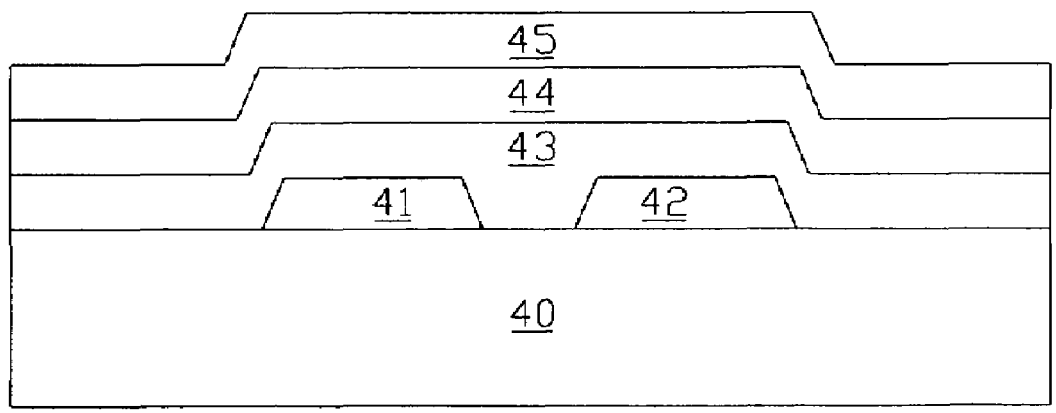

As shown in FIG. 4C, a first dielectric layer 43 is form on the substrate 40 and covers both the conductive structure 41 and the non-transparent structure 42, and then a first semi-conductive layer 44 and a second semi-conductive layer 45 are formed in proper sequence on the first dielectric layer 43.

Figure 4D:
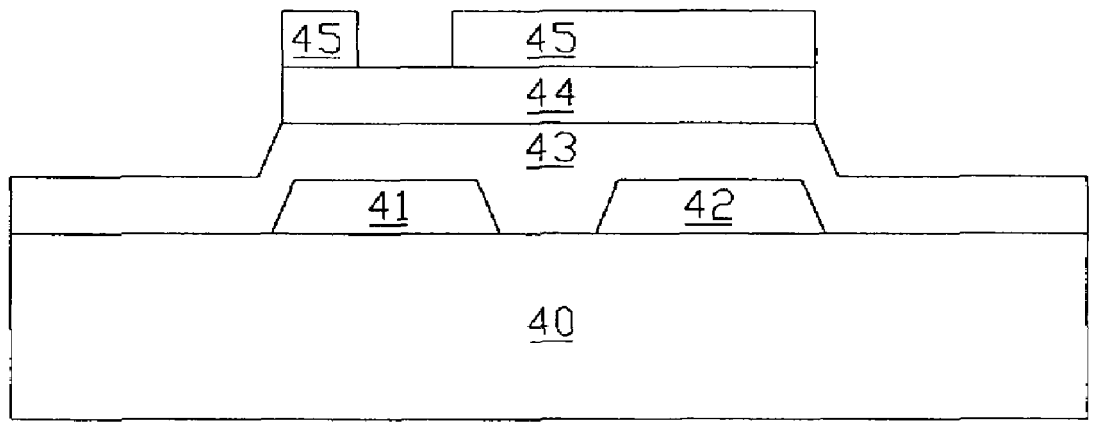

As shown in FIG. 4D, the portions of the second semi-conductive layer 45 and the first semi-conductive layer 44 are removed, and the remained portions of the second semi-conductive layer 45 and the first semi-conductive layer 44 are at least over the conductive structure 41. Of course, the present embodiment do not restrict the details of the pattern process but only requires to turn the structure shown in FIG. 4C into the one shown in FIG. 4D.

The first semi-conductive layer 44, which is used as a channel to meet the TFT needs and is commonly made of semiconductor, is easy to induce the light current. Hence, the present embodiment makes the remained portion of the first semi-conductive layer 44 at least covers the portion of the non-transparent structure 42. In addition, in order to reduce the change of the light transmitted from the substrate in the first semi-conductive layer 44, the second conductive 45 and the patterned conductive structure 47, the present embodiment can make the portions over and along the edge of the conductive structure 41 wider than others no matter in the semi-conductive layers 44 or 45; the present embodiment also can make the portions over and along the edge of the non-transparent structure 42 wider than others no matter in the semi-conductive layers 44 or 45.

Figure 4E:
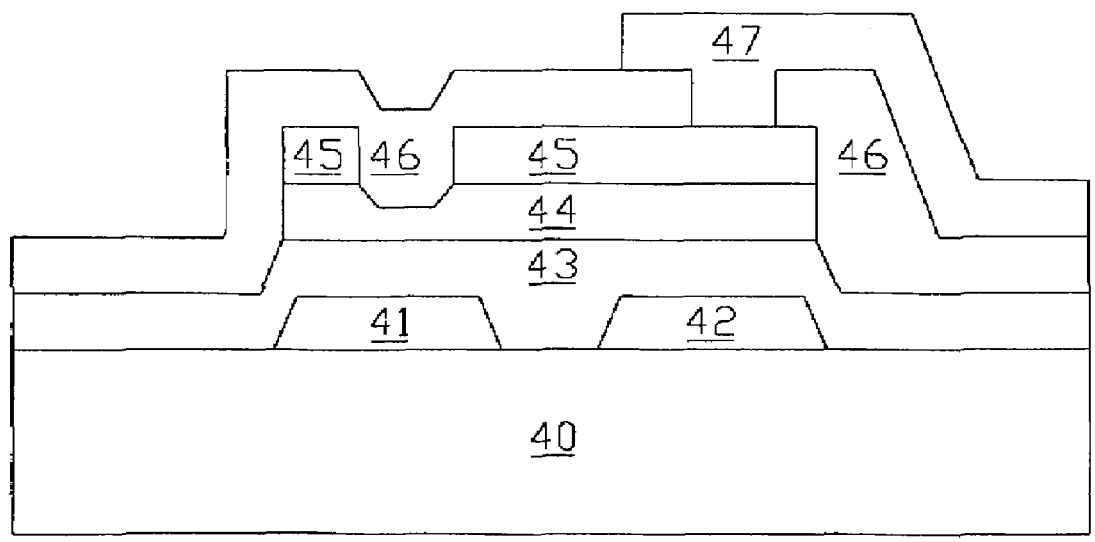

As shown in FIG. 4E, a second dielectric layer 46 is formed over the substrate 40 and covers the remained portions of the second semi-conductive layer 45 and the first semi-conductive layer 44, and further forms an open region on the second dielectric layer 46 and exposes the portion of the second semi-conductive layer 45. A patterned semi-conductive layer 47 is then formed on the second dielectric layer 46 and filled in the open region.

One characteristic, obviously, of the present embodiment is the process shown in FIG. 4A to form the conductive structure 41 and the non-transparent structure 42 on the substrate. The possibility of the induced light current resulted from the light transmitted from the substrate 40 can be substantially reduced by disposing the layout of the conductive structure 41 and the non-transparent structure 42 to make the first semi-conductive layer 44 and the second semi-conductive layer 45 (even the patterned semi-conductive layer 47) not only over the substrate 40 but also over the non-transparent structure 42.

Although specific embodiments have been illustrated and described, it will be obvious to those skilled in the art that various modifications may be made without departing from what is intended to be limited solely by the appended claims.

What is claimed is:

1. A method of forming a thin film transistor (TFT), comprising:
   providing a substrate;
   forming a gate and a non-transparent structure on said substrate;
   forming a dielectric layer which covers said gate on said substrate;
   forming a first semi-conductive layer on said dielectric layer;
   forming a second semi-conductive layer on said first semi-conductive layer;
   forming a photoresist layer on said second semi-conductive layer;
   placing a mask on said photoresist layer, wherein said mask has a slit pattern aimed at said gate;
   patterning said photoresist layer to form a photoresist pattern over said gate and still over said substrate around said gate, wherein said photoresist pattern further comprises a thin photoresist pattern formed under said slit pattern and a thick photoresist pattern;
   removing the portions of said second semi-conductive layer and said first semi-conductive layer without said photoresist pattern covering;
   removing said thin photoresist pattern; and
   removing the portion of said second semi-conductive layer without the portion of the photoresist pattern covering.

2. The method according to claim 1, wherein the center of said slit pattern is above the center of said gate.

3. The method according to claim 1, wherein said non-transparent structure electrically insulated from said gate, and said non-transparent structure and said gate are formed at the same time, and said non-transparent structure is at least under the portion of said first semi-conductive layer.

4. The method according to claim 1, wherein said photoresist pattern is removed after the portion of said second semi-conductive layer is removed, and then an extra dielectric layer is formed on the substrate to cover said first semi-conductive layer and said second semi-conductive layer.

5. The method according to claim 4, wherein said extra dielectric layer is patterned to form an open region to expose the portion of said second semi-conductive layer.

6. The method according to claim 5, comprising a patterned conductive structure formed on said extra dielectric layer and be filled in said open region.

7. The method according to claim 6, wherein said non-transparent structure electrically insulated from said gate is formed at the same time as said gate formed, said non-transparent structure is at least located under the portion of said patterned conductive structure.

8. The method according to claim 1, wherein the portion of said first semi-conductive layer without covering by the remained portion of said photoresist pattern is removed after removing the portion of said second semi-conductive layer.

9. The method according to claim 8, comprising an extra dielectric layer formed on said substrate to cover said first semi-conductive layer and second semi-conductive layer after removing said photoresist pattern.

10. The method according to claim 9, wherein said extra dielectric layer is patterned to form an open region to expose the portion of said second semi-conductive layer.

11. The method according to claim 10, wherein a patterned conductive structure is formed on said extra dielectric layer and filled in said open region.

12. The method according to claim 11, wherein said non-transparent structure electrically insulated from said gate is formed at the same time as said gate formed, said non-transparent structure is at least under the portion of said patterned conductive structure.

13. A method of forming a thin film transistor (TFT), comprising:
   providing a substrate;
   forming a conductive structure and a non-transparent structure on said substrate, wherein said conductive structure and said non-transparent structure are electrically insulated each other;
   forming a first dielectric layer on said substrate, wherein said first dielectric layer covers said conductive structure and said non-transparent structure;
   forming a first semi-conductive layer on said first dielectric layer;
   forming a second semi-conductive layer on said first semi-conductive layer;
   performing a pattern process to removing the portions of said second semi-conductive layer and said first semi-conductive layer, wherein the remained portions of said second semi-conductive layer and said first semi-conductive layer are at least over said conductive structure;
   forming a second dielectric layer on said substrate, wherein said second dielectric layer also covers both remained portions of said second and said first semi-conductive layers;
   forming an open region on said second dielectric layer to expose the portion of said second semi-conductive layer; and
   forming a patterned semi-conductive layer on said second dielectric and filling said open region.

14. The method according to claim 13, wherein the remained portion of said first semi-conductive layer at least covers the portion of said non-transparent structure.

15. The method according to claim 13, wherein the remained portions of said semi-conductive layers are adjusted along the edges of said conductive structure, and the remained portions of said semi-conductive layers over the conductive structure are wider than other portions.

16. The method according to claim 13, wherein the remained portions of said semi-conductive layers are adjusted along the edges of said non-transparent structure, and the remained portions of said semi-conductive layers over the non-transparent structure are wider than other portions.

* * * * *